(12) United States Patent
Chen et al.

(10) Patent No.: US 11,010,584 B2
(45) Date of Patent: May 18, 2021

(54) DISPLAY DEVICE AND SENSING ELEMENT SUBSTRATE CAPABLE OF INCREASING RATIO BETWEEN PHOTO CURRENT AND DARK CURRENT

(71) Applicant: Au Optronics Corporation, Hsinchu (TW)

(72) Inventors: Shin-Shueh Chen, Hsinchu County (TW); Che-Chia Chang, Hsinchu (TW); Shu-Wen Tzeng, Changhua County (TW); Yi-Wei Chen, Hsinchu County (TW); Pao-Yu Huang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 30 days.

(21) Appl. No.: 16/443,834

(22) Filed: Jun. 17, 2019

(65) Prior Publication Data
US 2020/0034599 A1 Jan. 30, 2020

(30) Foreign Application Priority Data

Jul. 24, 2018 (TW) ................................ 107125565

(51) Int. Cl.
*G09G 5/00* (2006.01)
*G06K 9/00* (2006.01)
(Continued)

(52) U.S. Cl.
CPC ......... *G06K 9/0004* (2013.01); *G06F 3/0421* (2013.01); *H01L 27/1214* (2013.01);
(Continued)

(58) Field of Classification Search
CPC .... G06F 3/042; G06K 3/0421; G06K 9/0004; H01L 27/1214; H01L 27/124; H01L 29/78633; G02F 1/13338
See application file for complete search history.

(56) References Cited

U.S. PATENT DOCUMENTS 6,243,155 B1    6/2001  Zhang et al.
8,946,732 B2    2/2015  Fan et al.
(Continued)

FOREIGN PATENT DOCUMENTS

CN    102707843        10/2012
CN    102830859    *   12/2012    ............. G06F 3/042
CN    107066162         8/2017

*Primary Examiner* — Adam J Snyder
(74) *Attorney, Agent, or Firm* — JCIPRNET

(57) ABSTRACT

A display device includes a pixel array substrate, a sensing element substrate, and a display medium layer. The display medium layer is disposed between the pixel array substrate and the sensing element substrate. The sensing element substrate includes a substrate, a switch element, an insulation layer, an electrically conductive layer, a signal line, a sensing layer, and an electrode layer. The switch element is disposed on the substrate. The insulation layer covers the switch element. The electrically conductive layer is disposed on the insulation layer. The signal line is electrically connected to the electrically conductive layer. The sensing layer covers a top surface of the electrically conductive layer, a first side of the electrically conductive layer, and a second side of the electrically conductive layer. The electrode layer covers the sensing layer. The electrode layer is electrically connected to the switching element.

18 Claims, 8 Drawing Sheets

(51) Int. Cl.
  *G06F 3/042* (2006.01)
  *H01L 27/12* (2006.01)
  H01L 29/786 (2006.01)
  G02F 1/1333 (2006.01)

(52) U.S. Cl.
  CPC ........ *G02F 1/13338* (2013.01); *H01L 27/124* (2013.01); *H01L 29/78633* (2013.01)

(56) References Cited

U.S. PATENT DOCUMENTS

| | | |
|---|---|---|
| 9,785,005 B2 | 10/2017 | Yeh et al. |
| 2003/0025136 A1* | 2/2003 | Zhang ............... H01L 27/14665 257/288 |
| 2011/0115724 A1* | 5/2011 | Jeon ........................ G06F 3/042 345/173 |
| 2011/0147746 A1* | 6/2011 | Kim .................... H01L 27/1222 257/59 |
| 2011/0227851 A1 | 9/2011 | Oh et al. |
| 2012/0138960 A1* | 6/2012 | Kim .................. H01L 27/14632 257/80 |
| 2013/0009888 A1* | 1/2013 | Park ..................... G06F 3/0416 345/173 |
| 2013/0033455 A1* | 2/2013 | Jeong ................... G09G 3/3696 345/175 |
| 2013/0270618 A1* | 10/2013 | Fan ..................... H01L 27/1462 257/290 |
| 2018/0019288 A1 | 1/2018 | Yang et al. |

* cited by examiner

DISPLAY DEVICE AND SENSING ELEMENT SUBSTRATE CAPABLE OF INCREASING RATIO BETWEEN PHOTO CURRENT AND DARK CURRENT

CROSS REFERENCE TO RELATED APPLICATION

This application claims the priority benefit of Taiwan application serial no. 107125565, filed on Jul. 24, 2018. The entirety of the above-mentioned patent application is hereby incorporated by reference herein and made a part of specification.

BACKGROUND OF THE INVENTION

Field of the Invention

The invention relates to a sensing device, and particularly relates to a sensing layer covering a top surface, a first side, and a second side of an electrically conductive layer.

Description of Related Art

Nowadays, to make the products more convenient to use, many manufacturers dispose sensing devices in their products. For example, the mobile phones nowadays are usually installed with a sensing device for fingerprint identification. According to the conventional fingerprint identification technology, the sensing device detects light reflected by the fingerprint of the finger. The peaks and troughs of the fingerprint may result in different intensities of the reflected light. In this way, the sensing device can distinguish among the patterns of different fingerprints.

However, when the light is dim or the peaks and troughs of the fingerprint are not so obvious, the detection of the sensing device may be erroneous. Under such a circumstance, it requires the user to repeat the sensing process, so that the sensing device can identify the fingerprint successfully.

SUMMARY OF THE INVENTION

One or some exemplary embodiments of the invention provides a display device capable of increasing a ratio between a photo current and a dark current when a sensing element substrate senses an object. With the display device, the sensitivity of the sensing element substrate is facilitated.

One or some exemplary embodiments of the invention provides a sensing element substrate capable of increasing the ratio between the photo current and the dark current. With the sensing element substrate, the sensitivity of a sensing device is facilitated.

At least one embodiment of the invention provides a display device. The display device includes a pixel array substrate, a sensing element substrate, and a display medium layer. The display medium layer is disposed between the pixel array substrate and the sensing element substrate. The sensing element substrate includes a substrate, a switch element, an insulation layer, an electrically conductive layer, a signal line, a sensing layer, and an electrode layer. The switch element is disposed on the substrate. The insulation layer covers the switch element. The electrically conductive layer is disposed on the insulation layer. The signal line is electrically connected to the electrically conductive layer. The sensing layer covers a top surface of the electrically conductive layer, a first side of the electrically conductive layer, and a second side of the electrically conductive layer. The electrode layer covers the sensing layer. The electrode layer is electrically connected to the switching element.

At least one embodiment of the invention provides a sensing element substrate. The sensing element substrate includes a substrate, a switch, an insulation layer, an electrically conductive layer, a signal line, a sensing layer, and an electrode layer. The switch element is disposed on the substrate. The insulation layer covers the switch element. The electrically conductive layer is disposed on the insulation layer. The signal line is electrically connected to the electrically conductive layer. The sensing layer covers a top surface of the electrically conductive layer, a first side of the electrically conductive layer, and a second side of the electrically conductive layer. The electrode layer covers the sensing layer. The electrode layer is electrically connected to the switching element.

Based on the above, the embodiments of the invention increase the light sensing area at the sides of the sensing layer. In this way, the ratio between the photo current and the dark current when the sensing element substrate senses an object can be increased.

In addition, the aperture ratio of the display device is increased.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
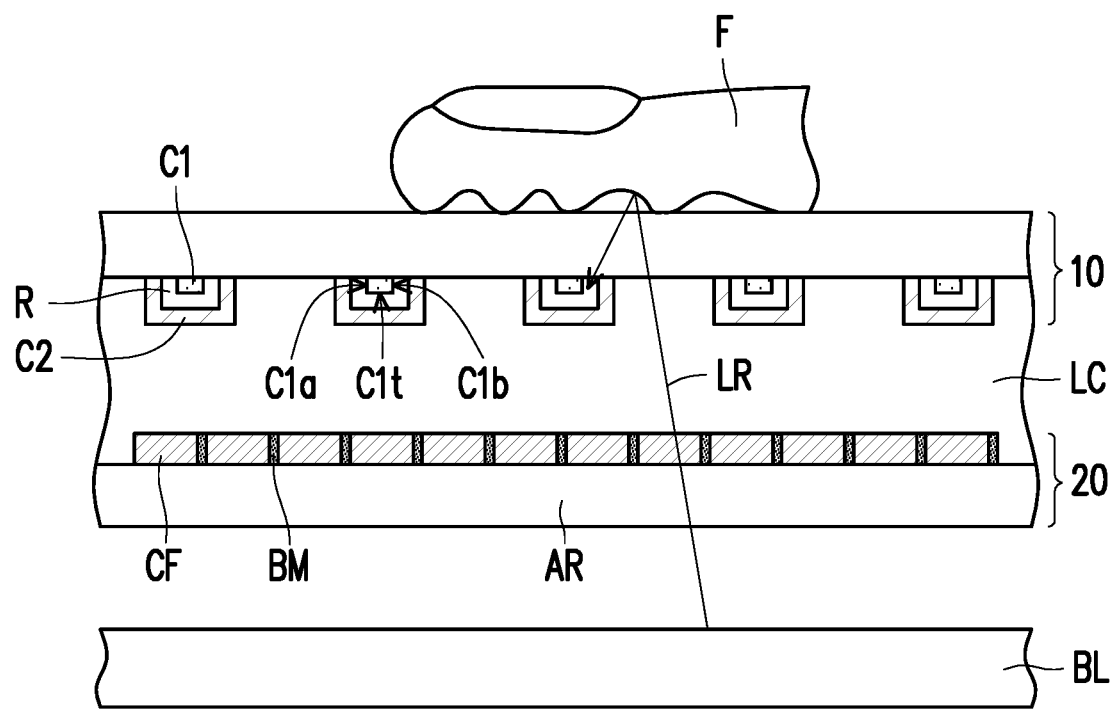
FIG. 1 is a cross-sectional view illustrating a display device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
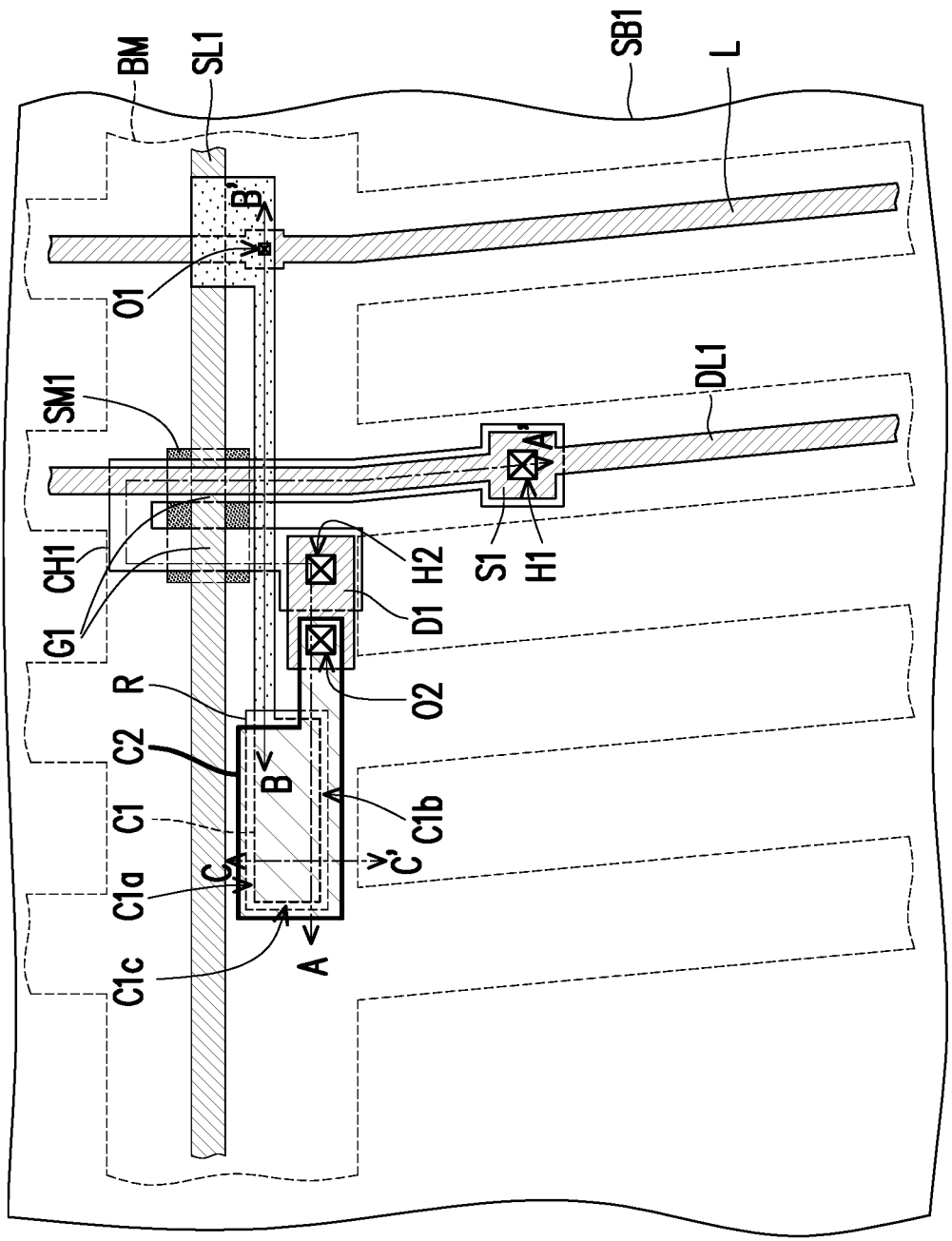
FIG. 2 is a schematic bottom view illustrating a sensing element substrate of a display device according to an embodiment of the invention.
Figure 3A:
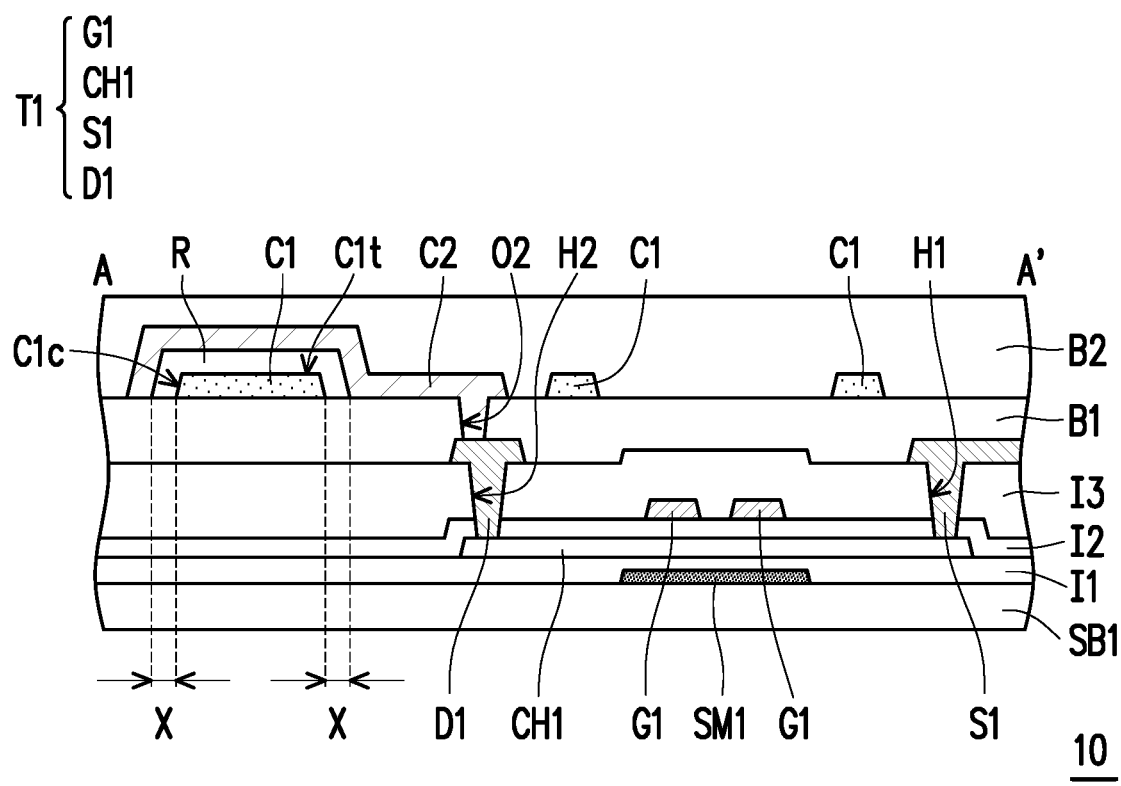
FIG. 3A is a schematic cross-sectional view along a cross-sectional line AA' of FIG. 2.
Figure 3B:
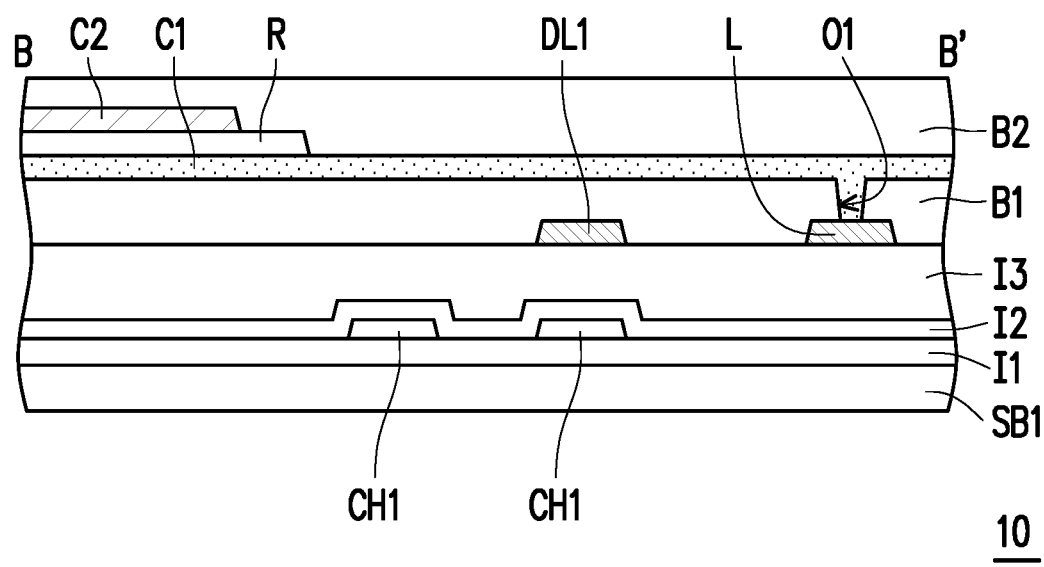
FIG. 3B is a schematic cross-sectional view along a cross-sectional line BB' of FIG. 2.
Figure 3C:
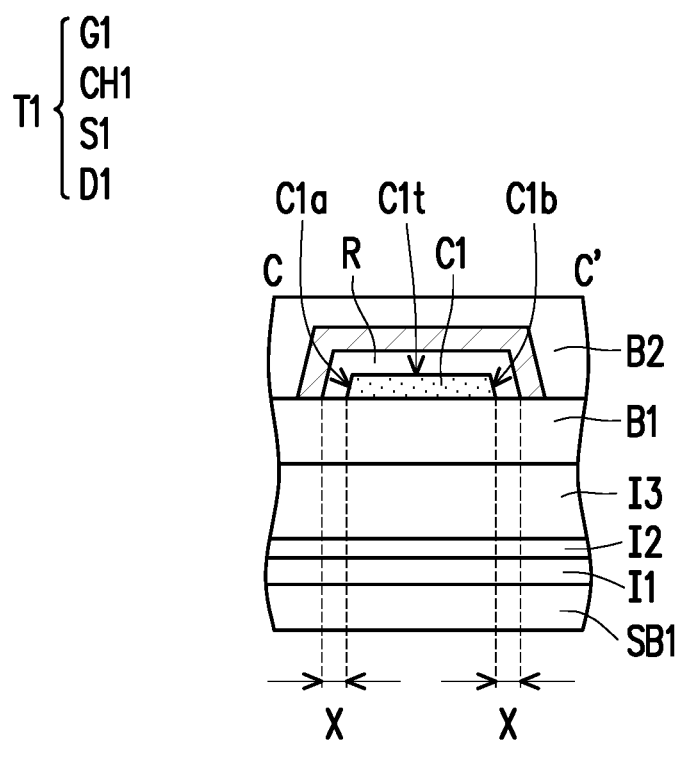
FIG. 3C is a schematic cross-sectional view along a cross-sectional line CC' of FIG. 2.

FIG. 1 is a cross-sectional view illustrating a display device according to an embodiment of the invention. For the ease of description, FIG. 1 omits some components in a sensing element substrate 10 and a pixel array substrate 20. FIG. 2 is a schematic bottom view illustrating a sensing element substrate of a display device according to an embodiment of the invention. FIG. 2 further illustrates a position relationship between a black matrix BM in the pixel array substrate and the sensing element substrate. FIG. 3A is a schematic cross-sectional view along a cross-sectional line AA' of FIG. 2. FIG. 3B is a schematic cross-sectional view along a cross-sectional line BB' of FIG. 2. FIG. 3C is a schematic cross-sectional view along a cross-sectional line CC' of FIG. 2.

A display device 1 includes the sensing element substrate 10, the pixel array substrate 20, and a display medium layer LC. The display medium layer LC is disposed between the pixel array substrate 20 and the sensing element substrate 10.

Referring to FIGS. 1, 2, 3A, 3B, and 3C at the same time, the sensing element substrate 10 includes a substrate SB1, a switch element T1, an insulation layer B1, an electrically conductive layer C1, a signal line L, a sensing layer R, and an electrode layer C2. In some embodiments, the sensing element substrate 10 further includes a light shielding layer SM1, an insulation layer I1, an insulation layer I2, an insulation layer I3, a passivation layer B2, a first scan line SL1, and a first data line DL1.

The material of the substrate SB1 may include glass, quartz, or an organic polymer, etc.

The light shielding layer SM1 is disposed on the substrate SB1. The material of the light shielding layer SM1 includes, for example, metal, resin, graphite, or other suitable materials. The light shielding layer SM1 may prevent the switch element T1 from generating a photo-leakage current, for example. The insulation layer I1 covers the light shielding layer SM1 and the substrate SB1, and the light shielding layer SM1 is disposed between the insulation layer I1 and the substrate SB1.

The switch element T1, the signal line L, the first scan line SL1, and the first data line DL1 are disposed on the substrate SB1.

The switch element T1 is disposed on the insulation layer I1, for example, and the light shielding layer SM1 is sandwiched between the switch element T1 and the substrate SB1. The switch element T1 includes a gate G1, a source S1, a drain D1, and a semiconductor channel layer CH1. The semiconductor channel layer CH1 is disposed on the insulation layer I1. The gate G1 is overlapped with the semiconductor channel layer CH1, and the insulation layer I2 is sandwiched between the gate G1 and the semiconductor channel layer CH1. The gate G1 is electrically connected with the first scan line SL1. In the embodiment, the gate G1 and the first scan line SL1 belong to the same electrically conductive layer. However, the invention is not limited thereto. The insulation layer I3 is disposed on the insulation layer I2. The source S1 and the drain D1 are disposed above the insulation layer I3, and the source S1 is electrically connected with the first data line DL1. In the embodiment, the source S1, the drain D1, the first data line DL1, and the signal line L belong to the same electrically conductive layer. However, the invention is not limited thereto. The source S1 and the drain D1 are electrically connected to the semiconductor channel layer CH1 through an opening H1 and an opening H2. The openings H1 and H2 are, for example, disposed in the insulation layer I3 and the insulation layer I2. The switch element T1 is described as a top-gate thin film transistor (TFT), for example. However, the invention is not limited thereto. According to other embodiments, the switch element T1 may also be a bottom-gate TFT or other suitable TFTs.

The insulation layer B1 covers the switch element T1. The electrically conductive layer C1 is disposed on the insulation layer B1. The signal line L is electrically connected to the electrically conductive layer C1. For example, the electrically conductive layer C1 is electrically connected to the signal line L through an opening O1, and the opening O1 is disposed in the insulation layer B1, for example. The material of the electrically conductive layer C1 may be a transparent, electrically conductive material, such as indium-tin oxide, indium-zinc oxide, aluminum-tin oxide, aluminum-zinc oxide, indium-gallium-zinc oxide, other suitable oxides, or a stacked layer of at least two of the aforementioned materials.

The sensing layer R covers a top surface $C1t$ of the electrically conductive layer C1, a first side $C1a$ of the electrically conductive layer C1, and a second side $C1b$ of the electrically conductive layer C1. In the embodiment, the electrically conductive layer C1 further has a third side $C1c$. The third side $C1c$ is connected with the first side $C1a$ and the second side $C1b$, and the sensing layer R covers the third side $C1c$ of the electrically conductive layer C1. The material of the sensing layer R is, for example, silicon-rich oxide (SRO) or other suitable materials. In the embodiment, the normal projection of the sensing layer R on the substrate SB1 is in a rectangular shape, and the long sides of the sensing layer R are parallel to the first scan line L1. However, the invention is not limited thereto.

The electrode layer C2 covers the sensing layer R. The sensing layer R is disposed between the top surface $C1t$ of the electrically conductive layer C1 and the electrode layer C2, between the first side $C1a$ of the electrically conductive layer C1 and the electrode layer C2, and between the second side $C1b$ of the electrically conductive layer C1 and the electrode layer C2. In the embodiment, the sensing layer R is further disposed between the third side $C1c$ of the electrically conductive layer C1 and the electrode layer C2. The electrode layer C2 is more distant from the substrate SB1 than the electrically conductive layer C1. The electrode layer C2 is closer to the pixel array substrate 20 than the electrically conductive layer C1.

The electrode layer C2 is electrically connected to the switch element T1. For example, the electrode layer C2 is electrically connected to the switch element T1 through the opening O2, and the opening O2 is located in the insulation layer B1, for example. The material of the electrode layer C2 includes, for example, molybdenum, aluminum, titanium, copper, gold, silver, or other electrically conductive materials or a stacked layer of two or more of the aforementioned materials. In an embodiment, the reflective index of the electrode layer C2 is 30% to 100%, and 50% to 100% is preferred.

In some embodiments, a minimum distance X between the edge of the normal projection of the electrode layer C2 on the substrate SB1 and the edge of the normal projection of the electrically conductive layer C1 on the substrate SB1 is 0.5 micrometers to 50 micrometers, and 2 micrometers to 20 micrometers is preferred. However, the invention is not limited thereto.

In the embodiment, the sensing element substrate 10 further includes a passivation layer B2. The passivation layer B2 covers the electrically conductive layer C1, the electrode layer C2, and the insulation layer B1. The passivation layer B2 is disposed between the electrode layer C2 and the display medium layer LC (shown in FIG. 1), for example.

Figure 4:
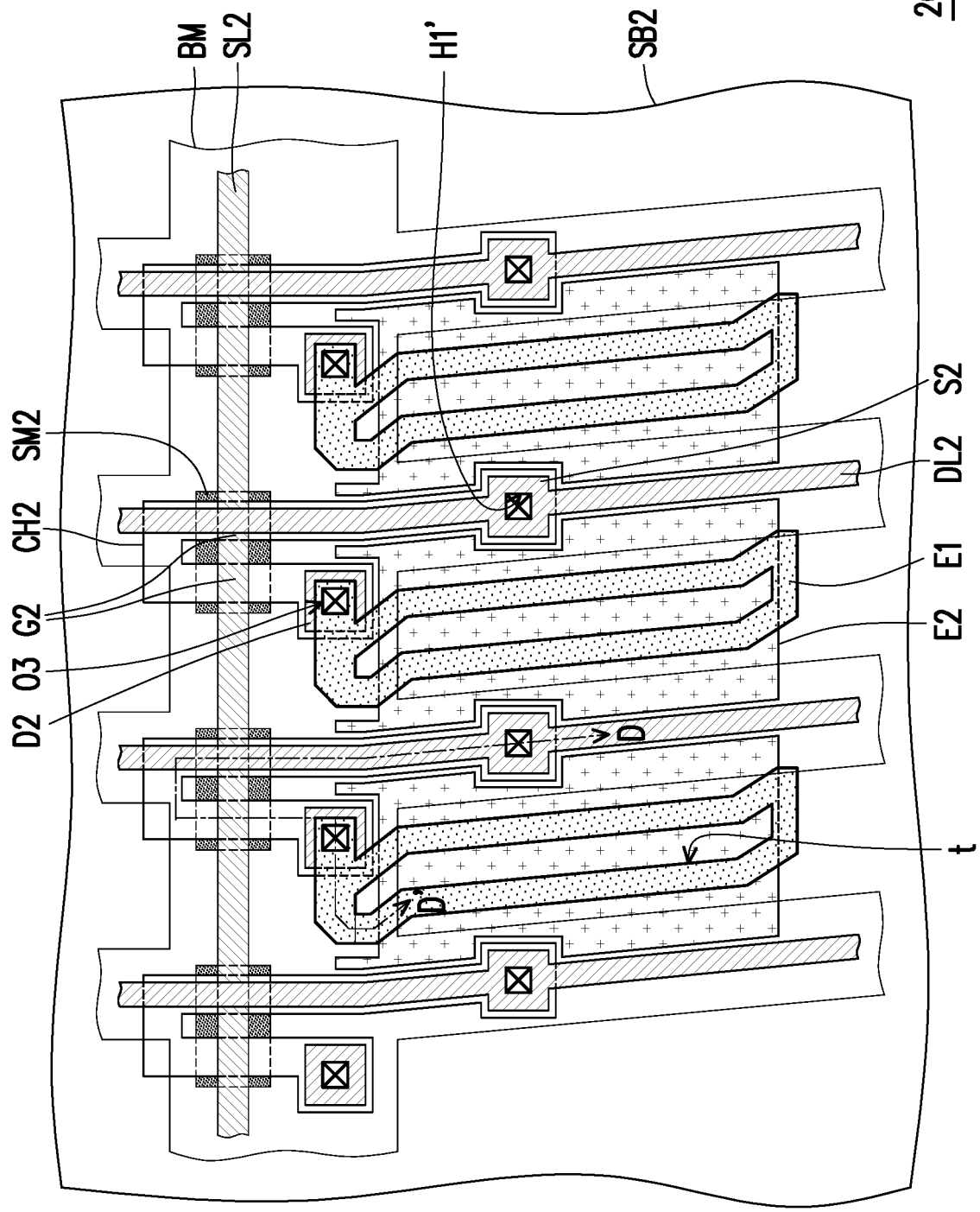
FIG. 4 is a schematic top view illustrating a pixel array substrate of a display device according to an embodiment of the invention.
Figure 5:
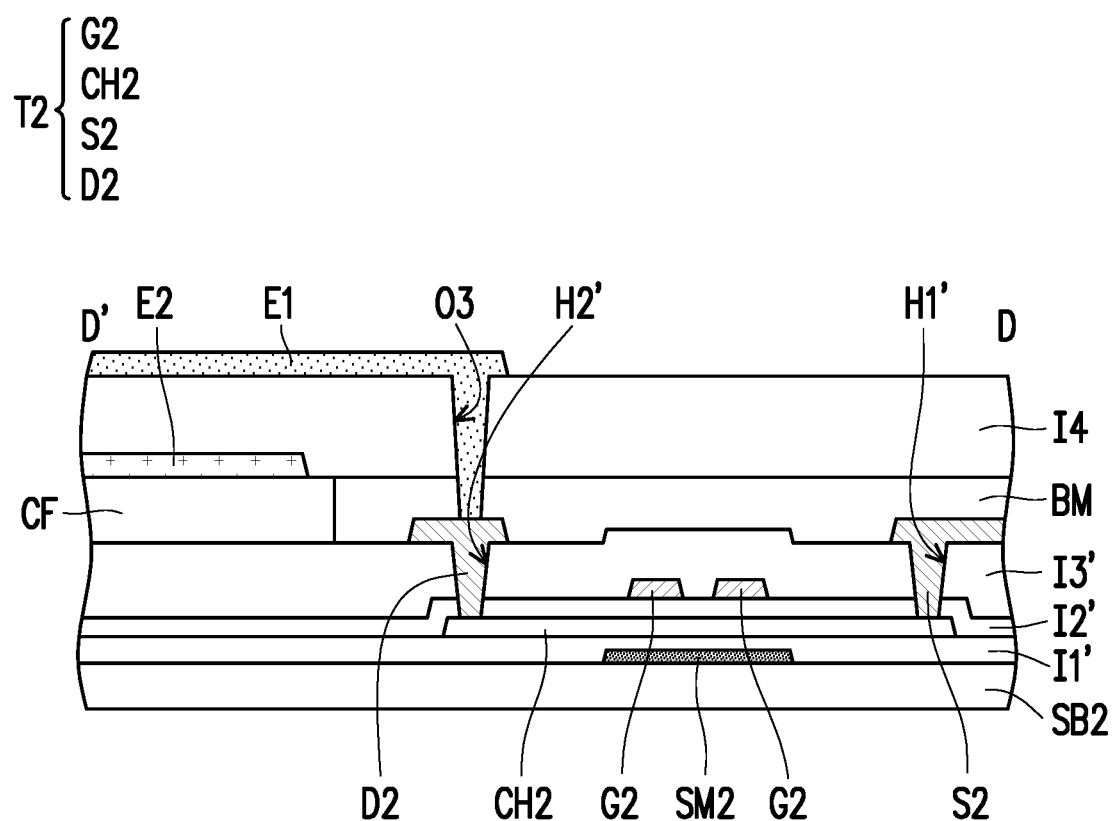
FIG. 5 is a schematic cross-sectional view along a cross-sectional line DD' of FIG. 4.
Figure 6:
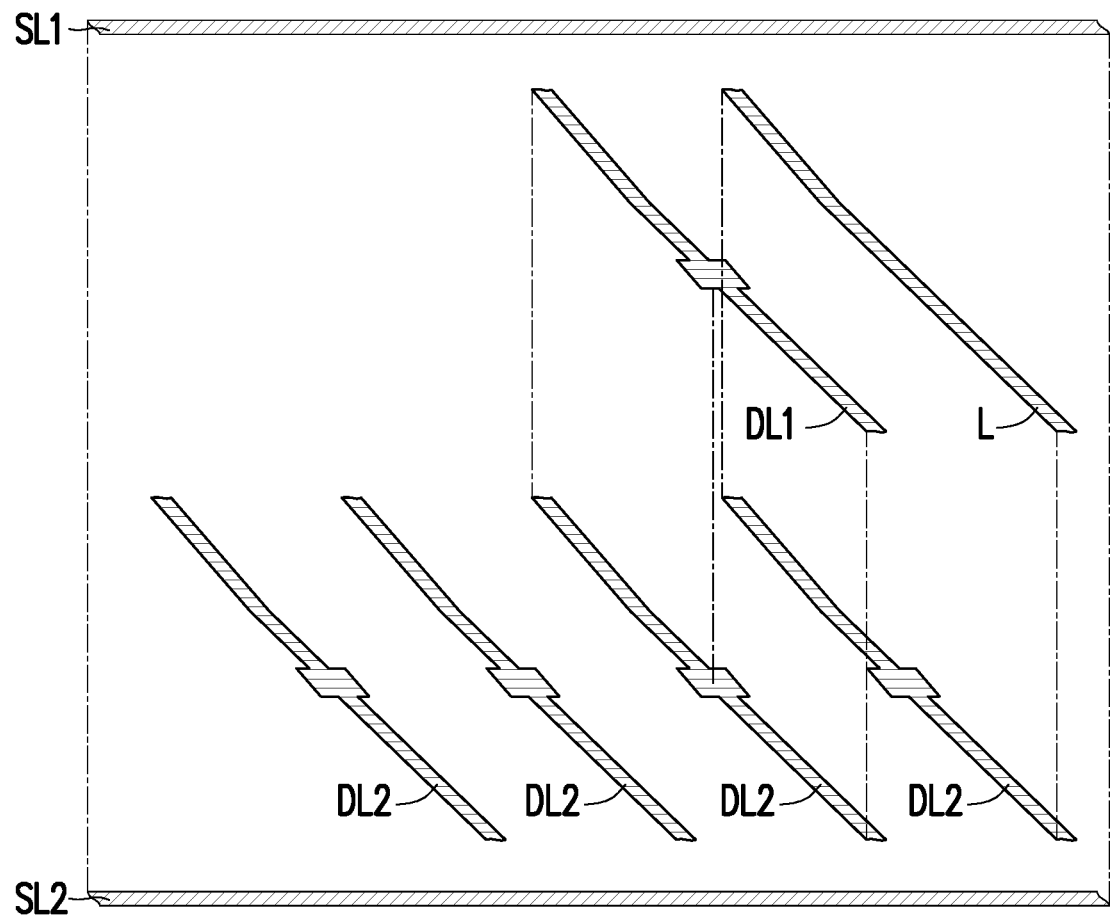
FIG. 6 is a schematic exploded view of a display device according to an embodiment of the invention.

FIG. 4 is a schematic top view illustrating a pixel array substrate of a display device according to an embodiment of the invention. For the ease of description, FIG. 4 omits a color filter pattern CF in FIG. 1. FIG. 5 is a schematic cross-sectional view along a cross-sectional line DD' of FIG. 4. FIG. 6 is a schematic exploded view of a display device according to an embodiment of the invention. For the ease of description, FIG. 6 illustrates a first scan line SL1, a first data line DL1, a second scan line SL2, a second data line DL2, and the signal line L, while other components are omitted.

Referring to FIGS. 1, 4, and 5, the pixel array substrate 20 includes a thin film transistor array AR, the color filter pattern CF, and the black matrix BM. In the embodiment, the pixel array substrate 20 further includes a substrate SB2, a light shielding layer SM2, an insulation layer I1', an insulation layer I2', an insulation layer I3', an insulation layer I4, a pixel electrode E1, and a common electrode E2.

The thin film transistor array AR includes a thin film transistor T2, the second scan line SL2, and the second data line DL2. The light shielding layer SM2, the thin film transistor T2, the second scan line SL2, and the second data line DL2 are located on the substrate SB2.

The thin film transistor T2 is disposed on the insulation layer I1', for example, and the light shielding layer SM2 is sandwiched between the thin film transistor T2 and the substrate SB2. The thin film transistor T2 includes a gate G2, a source S2, a drain D2, and a semiconductor channel layer CH2. The semiconductor channel layer CH2 is disposed on the insulation layer I1'. The gate G2 is overlapped with the semiconductor channel layer CH2, and the insulation layer I2' is sandwiched between the gate G2 and the semiconductor channel layer CH2. The gate G2 is electrically connected with the second scan line SL2. In the embodiment, the gate G2 and the second scan line SL2 belong to the same electrically conductive layer. However, the invention is not limited thereto. The insulation layer I3' is disposed on the insulation layer I2'. The source S2 and the drain D2 are disposed above the insulation layer I3', and the source S2 is electrically connected with the second data line DL2. In the embodiment, the source S2 and the second data line DL2 belong to the same electrically conductive layer. However, the invention is not limited thereto. The source S2 and the drain D2 are electrically connected to the semiconductor channel layer CH2 through an opening H1' and an opening H2'. The openings H1' and H2' are, for example, disposed in the insulation layer I3' and the insulation layer I2'. The thin film transistor T2 is described as a top-gate thin film transistor (TFT), for example. However, the invention is not limited thereto. According to other embodiments, the thin film transistor T2 may also be a bottom-gate TFT. In some embodiments, the manufacturing process for forming the thin film transistor T2 is similar to the manufacturing process for forming the switch element T1. Referring to FIGS. 2, 4, and 6, in some embodiments, the first scan line SL1 and the first data line DL1 are respectively overlapped with the second scan line SL2 and the second data line DL2 in a direction perpendicular to the substrate SB1 (which may also be construed as a direction perpendicular to the substrate SB2). In this way, the aperture ratio of the display device 1 can be increased. In some embodiments, the signal line L may also be overlapped with the second data line DL2 in the direction perpendicular to the substrate SB1 (which may also be construed as the direction perpendicular to the substrate SB2), so as to further increase the aperture ratio of the display device 1.

The color filter pattern CF is disposed on the thin film transistor array AR. The color filter CF includes, for example, a red filter pattern, a red filter pattern, a green filter pattern, a red filter pattern, and a blue filter pattern, for example. In some embodiment, the color filter pattern CF may also include filter patterns of other colors. The color filter pattern CF is disposed in correspondence with an opening of the pixel array substrate 20.

The black matrix BM is disposed on the thin film transistor array AR. The black matrix BM is disposed between the filter patterns of different colors, for example. The black matrix BM is disposed in correspondence with the thin film transistor T2, the second scan line SL2, and the second data line DL2 of the pixel array substrate 20.

Referring to FIGS. 2 and 4, the black matrix BM is overlapped with the electrically conductive layer C1, the sensing layer R, and the electrode layer C2 in the direction perpendicular to the substrate SB1 (which may also be construed as the direction perpendicular to the substrate SB2). In this way, the aperture ratio of the display device 1 can be increased. In some embodiments, the black matrix BM is further overlapped with the first scan line SL1, the first data line DL1, the second scan line SL2, the second data line DL2, the switch element T1, and the thin film transistor T2 in the direction perpendicular to the substrate SB1.

The common electrode E2 is disposed on the color filter pattern CF. In some embodiments, the common electrode E2 is electrically connected to a common voltage via a common signal line (not shown). The insulation layer I4 is disposed on the common electrode E2, the color filter pattern CF, and the black matrix BM.

In the embodiment, the pixel electrode E1 is disposed on the color filter pattern CF and/or the black matrix BM, the pixel electrode E1 is disposed on the insulation layer I4, and the pixel electrode E1 is overlapped with the common electrode E2. The pixel electrode E1 is electrically connected to the drain D2 of the thin film transistor T2 via an opening O3 in the black matrix BM and the insulation layer I4. However, the invention is not limited thereto. In other embodiments, the color filter pattern CF and/or the black matrix BM are disposed on the pixel electrode E1. The pixel electrode E1 includes a slit t.

In some embodiment, an alignment layer (not shown) is further disposed between the pixel electrode E1 and the display medium layer LC. However, the invention is not limited thereto.

Then, referring to FIG. 1, the display device 1 may further include a backlight module BL. The backlight module BL is disposed below the pixel array substrate 20. It may also be construed that the pixel array substrate 20 is disposed between the backlight module BL and the sensing element substrate 10. When a finger F approaches the sensing element substrate 10, light LR emitted from the backlight module BL is reflected to the sensing layer R by the finger F. Since the sensing layer R in the embodiment covers the top surface C1t of the electrically conductive layer C1, the first side C1a of the electrically conductive layer C1, and the second side C1b of the electrically conductive layer C1, the ratio between a photo current and a dark current when the sensing element substrate 10 senses the finger F can be increased. In this way, the sensitivity of the sensing element substrate 10 can be increased. In the embodiment, the black matrix BM is overlapped with the electrically conductive layer C1, the sensing layer R, and the electrode layer C2 in the direction perpendicular to the substrate SB1 (which may also be construed as the direction perpendicular to the substrate SB2). In this way, the aperture ratio of the display device 1 can be increased.

Figure 7:
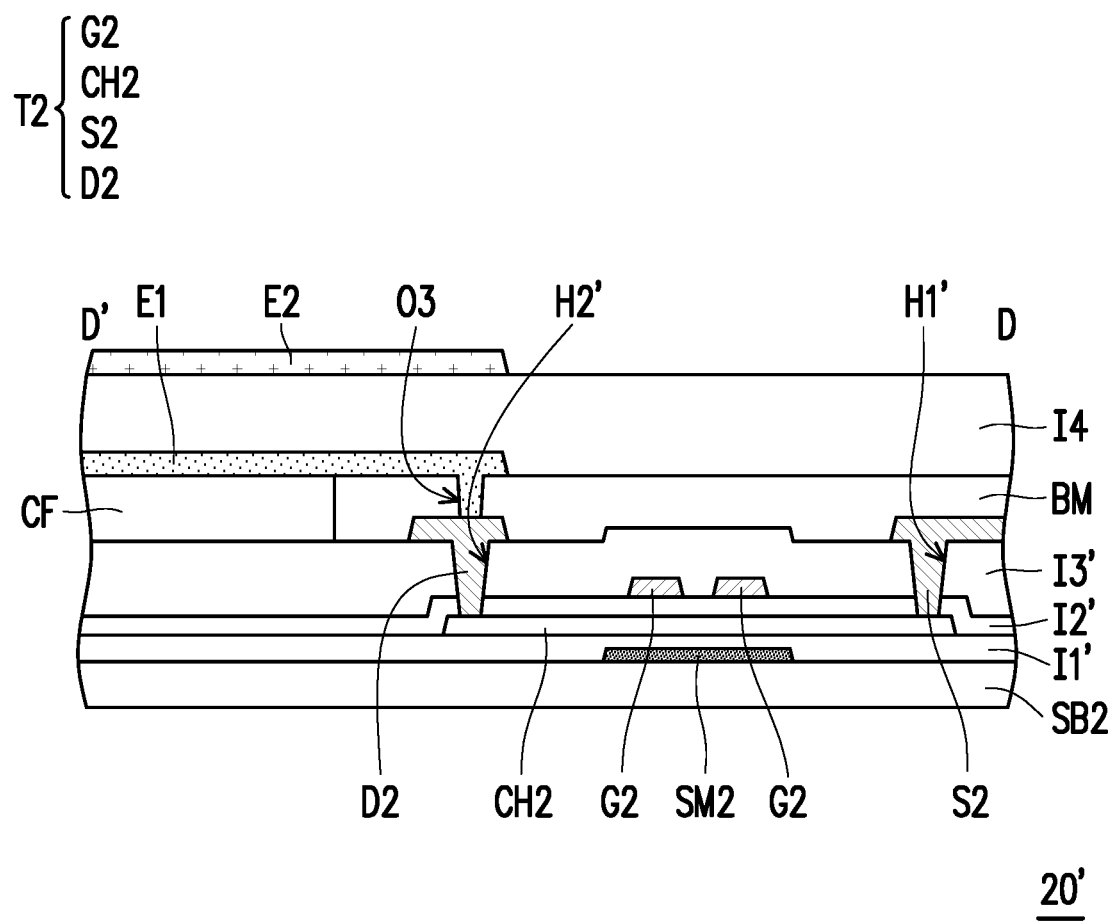
FIG. 7 is a schematic cross-sectional view illustrating a pixel array substrate of a display device according to an embodiment of the invention.

FIG. 7 is a schematic cross-sectional view illustrating a pixel array substrate of a display device according to an embodiment of the invention. It should be noted that the reference numerals and a part of the contents in the embodiment of FIG. 5 are used in the embodiment of FIG. 7, in which identical or similar reference numerals indicate identical or similar components, and repeated description of the same technical contents is omitted. For the detailed description of the omitted parts, reference can be found in the previous embodiment, and thus will not be repeated in the following.

The pixel array substrate 20 of FIG. 5 is described with an example where the pixel electrode E1 is disposed above the common electrode E2. A pixel array substrate 20' of FIG. 7 is described with an example where the common electrode E2 is disposed above the pixel electrode E1.

In the embodiment of FIG. 7, the pixel electrode E1 is located between the common electrode E2 and the substrate SB2, and the common electrode E2 has slits (not shown).

Based on the above, the display device according to the embodiments of the invention has an increased light sensing area at the sides of the sensing layer. In this way, the ratio between the photo current and the dark current when the sensing element substrate senses an object can be increased. In addition, since the black matrix is overlapped with the electrically conductive layer, the sensing layer, and the electrode layer in the direction perpendicular to the substrate, the aperture ratio of the display device can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display device, comprising:
   a pixel array substrate;
   a sensing element substrate, comprising:
      a substrate;
      a switch element, disposed on the substrate;
      an insulation layer, covering the switch element;
      an electrically conductive layer, disposed on the insulation layer;
      a signal line, electrically connected to the electrically conductive layer;
      a sensing layer, covering a top surface of the electrically conductive layer, a first side of the electrically conductive layer, and a second side of the electrically conductive layer; and
      an electrode layer, covering the sensing layer, wherein the electrode layer is electrically connected to the switch element, wherein the electrically conductive layer and the sensing layer are disposed in a groove of the electrode layer, and the top surface of the electrically conductive layer, the first side of the electrically conductive layer, and the second side of the electrically conductive layer are both facing to an inner side of the groove; and
   a display medium layer, disposed between the pixel array substrate and the sensing element substrate.

2. The display device as claimed in claim 1, wherein the sensing layer is disposed between the top surface of the electrically conductive layer and the electrode layer, between the first side of the electrically conductive layer and the electrode layer, and between the second side of the electrically conductive layer and the electrode layer.

3. The display device as claimed in claim 1, wherein a minimum distance between an edge of a normal projection of the electrode layer on the substrate and an edge of a normal projection of the electrically conductive layer on the substrate is 0.5 micrometers to 50 micrometers.

4. The display device as claimed in claim 1, wherein the electrically conductive layer further comprises a third side, the third side of the electrically conductive layer is connected with the first side of the electrically conductive layer and the second side of the electrically conductive layer, and the sensing layer covers the third side of the electrically conductive layer.

5. The display device as claimed in claim 4, wherein the sensing layer is disposed between the top surface of the electrically conductive layer and the electrode layer, between the first side of the electrically conductive layer and the electrode layer, between the second side of the electrically conductive layer and the electrode layer, and between the third side of the electrically conductive layer and the electrode layer.

6. The display device as claimed in claim 1, further comprising a light shielding layer disposed between the switch element and the substrate.

7. The display device as claimed in claim 1, further comprising a passivation layer disposed between the electrode layer and the display medium layer.

8. The display device as claimed in claim 1, wherein the pixel array substrate comprises:
   a thin film transistor array;
   a color filter pattern, disposed on the thin film transistor array; and
   a black matrix, disposed on the thin film transistor array and overlapped with the electrically conductive layer, the sensing layer, and the electrode layer in a direction perpendicular to the substrate.

9. The display device as claimed in claim 1, wherein the electrode layer is closer to the pixel array substrate than the electrically conductive layer.

10. The display device as claimed in claim 1, wherein:
    the sensing element substrate further comprises a first scan line and a first data line, wherein the first scan line and the first data line are electrically connected to the switch element; and
    the pixel array substrate further comprises a second scan line and a second data line,
    wherein the first scan line and the first data line are respectively overlapped with the second scan line and the second data line in a direction perpendicular to the substrate.

11. The display device as claimed in claim 10, wherein a normal projection of the sensing layer on the substrate is in a rectangular shape, and long sides of the sensing layer are parallel to the first scan line.

12. The display device as claimed in claim 1, wherein a material of the electrode layer comprises metal, and the electrode layer at least covers a top surface of the sensing layer, a first side of the sensing layer, and a second side of the sensing layer.

13. A sensing element substrate, comprising:
    a substrate;
    a switch element, disposed on the substrate;
    an insulation layer, covering the switch element;

an electrically conductive layer, disposed on the insulation layer;

a signal line, electrically connected to the electrically conductive layer;

a sensing layer, covering a top surface of the electrically conductive layer, a first side of the electrically conductive layer, and a second side of the electrically conductive layer; and an electrode layer, covering the sensing layer, wherein the electrode layer is electrically connected to the switch element, wherein the electrically conductive layer and the sensing layer are disposed in a groove of the electrode layer, and the top surface of the electrically conductive layer, the first side of the electrically conductive layer, and the second side of the electrically conductive layer are both facing to an inner side of the groove.

14. The sensing element substrate as claimed in claim 13, wherein the sensing layer is disposed between the top surface of the electrically conductive layer and the electrode layer, between the first side of the electrically conductive layer and the electrode layer, and between the second side of the electrically conductive layer and the electrode layer.

15. The sensing element substrate as claimed in claim 13, wherein the electrically conductive layer further comprises a third side, the third side is connected to the first side and the second side, and the sensing layer covers the third side of the electrically conductive layer.

16. The sensing element substrate as claimed in claim 15, wherein the sensing layer is disposed between the top surface of the electrically conductive layer and the electrode layer, between the first side of the electrically conductive layer and the electrode layer, between the second side of the electrically conductive layer and the electrode layer, and between the third side of the electrically conductive layer and the electrode layer.

17. The sensing element substrate as claimed in claim 13, wherein the electrode layer is more distant from the substrate than the electrically conductive layer.

18. The sensing element substrate as claimed in claim 13, wherein a material of the electrode layer comprises metal, and the electrode layer at least covers a top surface of the sensing layer, a first side of the sensing layer, and a second side of the sensing layer.

\* \* \* \* \*